(12) United States Patent
Boyd et al.

(10) Patent No.: US 7,648,616 B1
(45) Date of Patent: Jan. 19, 2010

(54) APPARATUS AND METHOD FOR SEMICONDUCTOR WAFER ELECTROPLANARIZATION

(75) Inventors: John M. Boyd, Hillsboro, OR (US);
Fritz C. Redeker, Fremont, CA (US);
Yezdi Dordi, Palo Alto, CA (US);
Michael Ravkin, Sunnyvale, CA (US);
Robert Maraschin, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 860 days.

(21) Appl. No.: 11/394,777

(22) Filed: Mar. 31, 2006

(51) Int. Cl.
*C25F 7/00* (2006.01)
*C25B 9/08* (2006.01)

(52) U.S. Cl. .................. 204/252; 204/295; 205/640
(58) Field of Classification Search .............. 204/252, 204/295; 205/640
See application file for complete search history.

(56) References Cited

U.S. PATENT DOCUMENTS 5,372,689 A * 12/1994 Carlson et al. .............. 204/252
7,208,076 B2 * 4/2007 Kobata et al. ............... 205/652
2007/0051639 A1 * 3/2007 Mazur et al. ................ 205/666

* cited by examiner

*Primary Examiner*—Harry D. Wilkens, III
*Assistant Examiner*—Nicholas A. Smith
(74) *Attorney, Agent, or Firm*—Martine, Penilla & Gencarella, LLP

(57) ABSTRACT

A number of apertures are defined within a wall of a chamber defined to maintain an electrolyte solution. A cation exchange membrane is disposed within the chamber over the number of apertures. The electrolyte solution pressure within the chamber causes the cation exchange membrane to extend through the apertures beyond an outer surface of the chamber. A cathode is disposed within the chamber. The cathode is maintained at a negative bias voltage relative to a top surface of a wafer to be planarized. When the top surface of the wafer is brought into proximity of the cation exchange membrane extending through the apertures, and a deionized water layer is disposed between the top surface of the wafer and the cation exchange membrane, a cathode half-cell is established such that metal cations are liberated from the top surface of the wafer and plated on the cathode in the chamber.

20 Claims, 15 Drawing Sheets

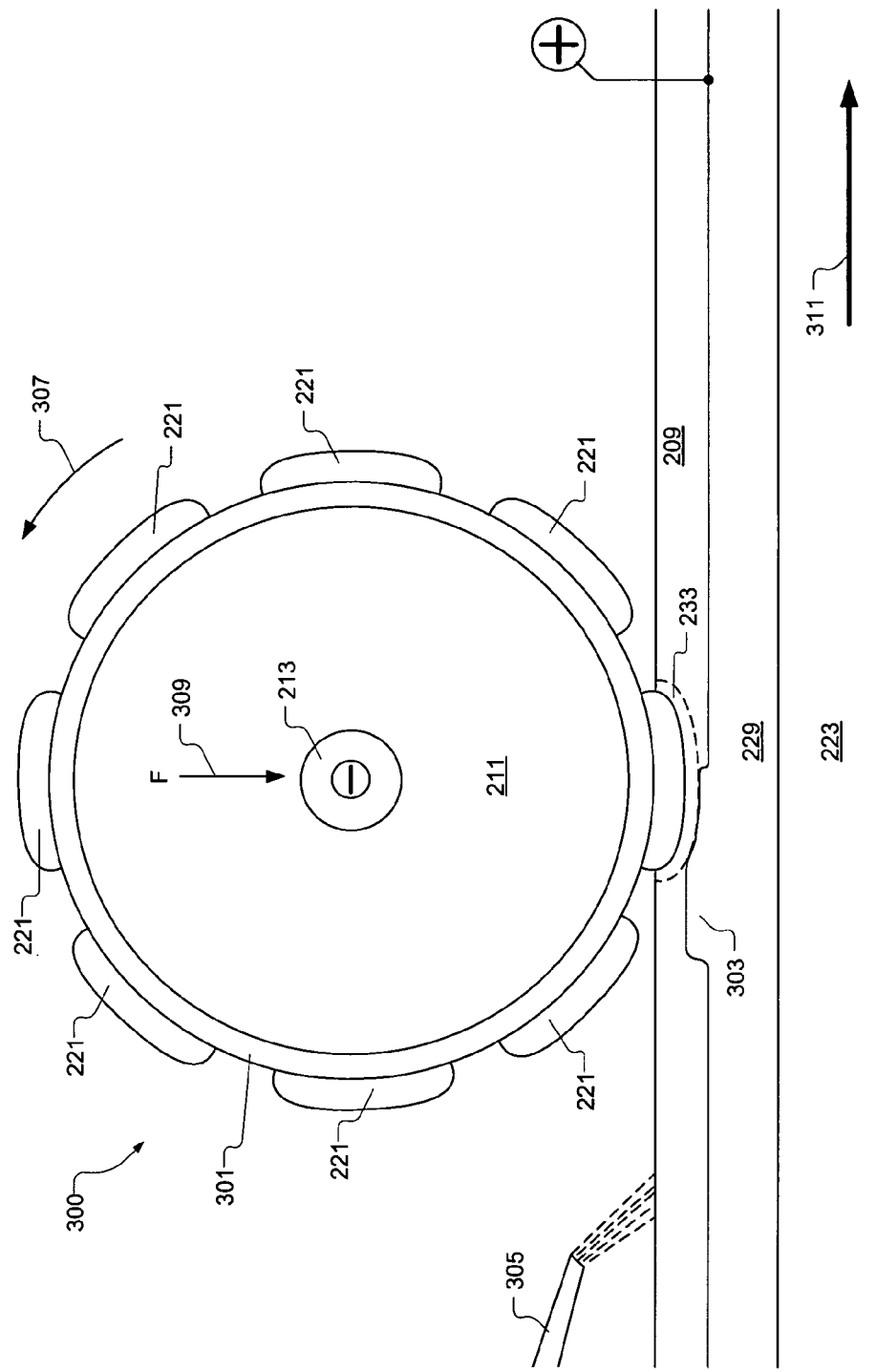

APPARATUS AND METHOD FOR SEMICONDUCTOR WAFER ELECTROPLANARIZATION

CROSS REFERENCE TO RELATED APPLICATIONS

"This application is related to U.S. patent application Ser. No. 11/395,881, filed on Mar. 31, 2006, now U.S. Pat. No. 7,396,430, and entitled "Apparatus and Method for Confined Area Planarization," and U.S. patent application Ser. No. 10/879,263, filed on Jun. 28, 2004, and entitled "Method and Apparatus for Plating Semiconductor Wafers," and U.S. patent application Ser. No. 10/879,396, filed on Jun. 28, 2004, now U.S. Pat. No. 7,563,348, and entitled "Electroplating Head and Method for Operating the Same." The disclosure of each of these related applications is incorporated herein by reference."

BACKGROUND OF THE INVENTION

In the fabrication of semiconductor devices such as integrated circuits, memory cells, and the like, a series of manufacturing operations are performed to define features on semiconductor wafers. The semiconductor wafers include integrated circuit devices in the form of multi-level structures defined on a silicon substrate. At a substrate level, transistor devices with diffusion regions are formed. In subsequent levels, interconnect metalization lines are patterned and electrically connected to the transistor devices to define a desired integrated circuit device. Also, patterned conductive layers are insulated from other conductive layers by dielectric materials.

During conductive interconnect manufacturing, a metal layer is deposited on the wafer. The deposited metal will fill regions on the wafer between smaller features, such as sub-micron features, faster than larger regions, such as trench regions. Because the smaller features may span relatively large areas of the wafer, it should be appreciated that these large areas of the wafer may have an increased topography. The increased topography regions need to be planarized in conjunction with planarization of the decreased topography regions. Simultaneous planarization of both the increased and decreased topography areas of the wafer poses a challenge. For example, to achieve sufficient planarization of the increased topography areas of the wafer, an extended over-polishing period may be required. However, exposure of the decreased topography areas of the wafer to this extended overpolishing period may cause removal of too much material from the decreased topography areas, e.g., the barrier layer underlying the deposited metal may be undesirably exposed and/or damaged.

SUMMARY OF THE INVENTION

In one embodiment, an electroplanarization (EP) apparatus is disclosed. The EP apparatus includes a cylinder defined by a cylindrical wall and a pair of endcaps disposed to enclose a respective end of the cylinder. A number of apertures are defined through the cylindrical wall. The EP apparatus also includes a cation exchange membrane disposed on an inner surface of the cylindrical wall to cover each of the number of apertures. The cation exchange membrane is defined to extend through the number of apertures, such that an outer surface of the cation exchange membrane extends beyond an outer surface of the cylindrical wall. The EP apparatus further includes a cathode disposed within an inner cavity of the cylinder. The cathode is defined to be in fluid communication with an electrolyte solution to be maintained within the cylinder, wherein the electrolyte solution is also maintained in contact with an inner surface of the cation exchange membrane.

In another embodiment, another EP apparatus is disclosed. The EP apparatus includes a chamber defined by a lower disc-shaped wall, an upper disc-shaped wall, and a cylindrical side wall. A number of apertures are defined through the lower disc-shaped wall. The EP apparatus also includes a cation exchange membrane disposed on an upper surface of the lower disc-shaped wall to cover each of the number of apertures. The cation exchange membrane is defined to extend through the number of apertures such that a lower surface of the cation exchange membrane extends beyond a lower surface of the lower disc-shaped wall. The EP apparatus further includes a cathode disposed within the chamber. The cathode is defined to be in fluid communication with an electrolyte solution to be maintained within the chamber, wherein the electrolyte solution is also maintained in contact with an upper surface of the cation exchange membrane.

In another embodiment, another EP apparatus is disclosed. The EP apparatus includes a platen. The platen includes a chamber bounded by an upper plate. A number of apertures are defined through the upper plate of the platen. The EP apparatus also includes a cation exchange membrane disposed within the chamber below the upper plate, such that each of the number of apertures is covered by the cation exchange membrane. The cation exchange membrane is defined to extend through the number of apertures such that an upper surface of the cation exchange membrane extends beyond an upper surface of the upper plate of the platen. The EP apparatus further includes a cathode disposed within the chamber. The cathode is defined to be in fluid communication with an electrolyte solution to be maintained within the chamber, wherein the electrolyte solution is also maintained in contact with a lower surface of the cation exchange membrane.

In another embodiment, a method is disclosed for planarizing a semiconductor wafer. The method includes an operation for rotating a cylindrical EP apparatus. The cylindrical EP apparatus includes an inner cavity defined by a cylindrical wall having a number of apertures defined through the cylindrical wall. The EP apparatus also includes a cation exchange membrane disposed on an inner surface of the cylindrical wall, such that each of the apertures is covered by the cation exchange membrane. The cation exchange membrane is defined to extend through the number of apertures such that an outer surface of the cation exchange membrane extends beyond an outer surface of the cylindrical wall. The EP apparatus further includes a cathode disposed within the inner cavity to be in fluid communication with an electrolyte solution to be maintained within the inner cavity, wherein the electrolyte solution is also maintained in contact with an inner surface of the cation exchange membrane. The method also includes an operation for positioning the cylindrical EP apparatus over a wafer to be planarized such that the outer surface of the cation exchange membrane is brought within proximity to a top surface of the wafer when the cylindrical EP apparatus is rotated. The method further includes an operation for dispensing deionized water over the top surface of the wafer and beneath the cylindrical EP apparatus. Also in the method, an operation is performed to maintain the cathode at a negative bias voltage relative to the top surface of the wafer.

In another embodiment, another method is disclosed for planarizing a semiconductor wafer. The method includes an operation for rotating an EP head. The EP head includes a chamber defined by a lower disc-shaped wall, an upper disc-shaped wall, and a cylindrical side wall. A number of apertures are defined through the lower disc-shaped wall. The EP head also includes a cation exchange membrane disposed on an upper surface of the lower disc-shaped wall to cover each of the number of apertures. The cation exchange membrane is defined to extend through the number of apertures, such that a lower surface of the cation exchange membrane extends beyond a lower surface of the lower disc-shaped wall. The EP apparatus further includes a cathode disposed within the chamber. The cathode is defined to be in fluid communication with an electrolyte solution to be maintained within the chamber, wherein the electrolyte solution is also maintained in contact with an upper surface of the cation exchange membrane. The method also includes an operation for positioning the EP head over a wafer to be planarized such that the lower surface of the cation exchange membrane is within proximity to a top surface of the wafer when the EP head is rotated. The method further includes an operation for dispensing deionized water over the top surface of the wafer and beneath the electroplanarization head. Also in the method, an operation is included for maintaining the cathode at a negative bias voltage relative to the top surface of the wafer.

In another embodiment, another method is disclosed for planarizing a semiconductor wafer. The method includes an operation for securing a wafer on a wafer carrier. The method includes another operation for positioning the wafer carrier over a platen, such that a top surface of the wafer faces the platen in a substantially planar orientation with respect to the platen. The platen is defined to include a chamber bounded by an upper plate. A number of apertures are defined through the upper plate. The platen also includes a cation exchange membrane disposed within the chamber below the upper plate, such that each of the number of apertures is covered by the cation exchange membrane. The cation exchange membrane is defined to extend through the number of apertures, such that an upper surface of the cation exchange membrane extends beyond an upper surface of the platen upper plate. The platen further includes a cathode disposed within the chamber. The cathode is defined to be in fluid communication with an electrolyte solution to be maintained within the chamber, wherein the electrolyte solution is also maintained in contact with a lower surface of the cation exchange membrane. The method also includes an operation for dispensing deionized water over the top surface of the platen to cover the cation exchange membrane extending beyond the upper surface of the upper plate of the platen. The method further includes an operation for rotating the wafer carrier with the top surface of the wafer in proximity to the cation exchange membrane extending beyond the upper surface of the upper plate of the platen. Also in the method, an operation is provided for maintaining the cathode at a negative bias voltage relative to the top surface of the wafer.

Other aspects and advantages of the invention will become more apparent from the following detailed description, taken in conjunction with the accompanying drawings, illustrating by way of example the present invention.

BRIEF DESCRIPTION OF THE DRAWINGS

FIGS. 3E-3G are a series of illustrations showing traversal of the wafer beneath the cylindrical EP apparatus, in accordance with one embodiment of the present invention;

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

During copper interconnect manufacturing on a semiconductor wafer ("wafer"), a copper layer may be deposited on a seed/barrier layer using an electroplating process. Components in the electroplating solution provide for appropriate gap fill on sub-micron features. However, these sub-micron features tend to plate faster than the bulk areas and larger trench regions, i.e., greater than 1 micron. The sub-micron regions are typically found in large memory arrays such as static random access memory (SRAM), and can span large areas of the wafer. It should be appreciated that this causes large areas of the wafer to have additional topography that needs to be planarized, in addition to the larger trench regions that also need to be planarized.

Figure 1:
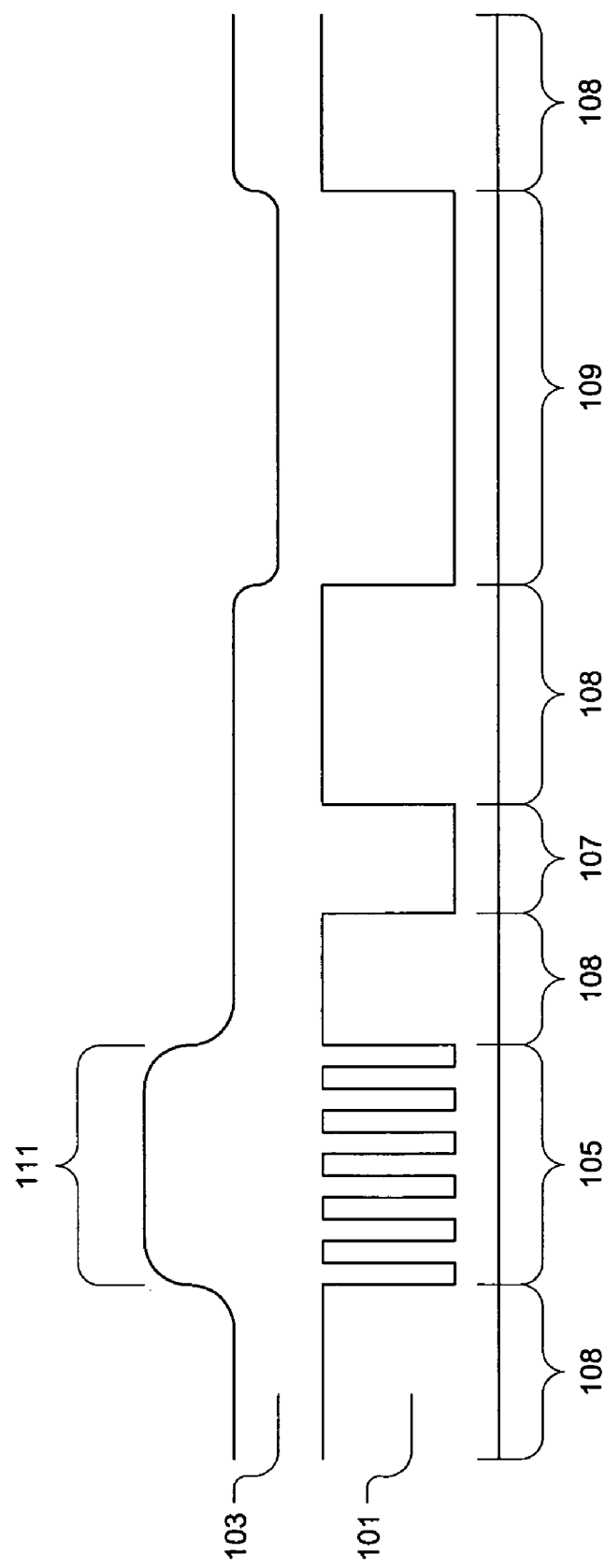
FIG. 1 is a simplified schematic diagram illustrating a silicon substrate having a copper layer deposited thereon.

FIG. 1 is a simplified schematic diagram illustrating a silicon substrate having a copper layer deposited thereon. A copper layer 103 is deposited on a seed/barrier layer (not shown for clarity reasons) disposed over a wafer 101 using an electroplating process. As previously mentioned, components in the electroplating solution provide for good gap fill on sub-micron features, such as sub-micron trenches in region 105, but these features tend to plate faster than the bulk areas and trench regions 107 and 109. High regions or "steps"

in the topography of the substrate, illustrated by region 111, result over the sub-micron trench region 105. These steps are also referred to as "superfill" regions. The superfill region 111 is defined by thicker copper film than field regions 108 and trench regions 107 and 109. The superfill region 111 must be planarized in conjunction with the topography over the field regions 108 and trench regions 107 and 109.

Current planarization techniques are not suited to handle the superfill topography in an efficient manner, i.e., planarization techniques are sensitive to pattern density and circuit layout. More specifically, chemical mechanical planarization (CMP) processes often must be tuned according to the incoming wafer properties. Therefore, changes are made to the CMP process (such as changing step times, overpolish time, or endpoint algorithms, for example) in order to accommodate variations within or between wafer lots. Also, such changes are made to the CMP process to accommodate different pattern densities and circuit layouts encountered on wafers of mixed-product manufacturing lines.

When attempting to perform a single CMP process on the topography having superfill regions, excessive dishing and erosion can occur in trench regions 107 and 109 when overpolishing is performed in order to completely remove the remaining copper from the superfill region 111. Additionally, not only is the CMP process required to remove the excess copper in the superfill region 111, but the CMP process is also required to perform this removal in a manner that follows a contour of the wafer. The contour of the wafer is due to waviness inherent in the silicon substrate of the wafer. The waviness is typically on the order of 0.2 micron to 0.5 micron total thickness variation. Current CMP processes do not suitably deal with both superfill region topography and wafer contour, while effectively planarizing other topography in the trench and field regions.

Figure 2:
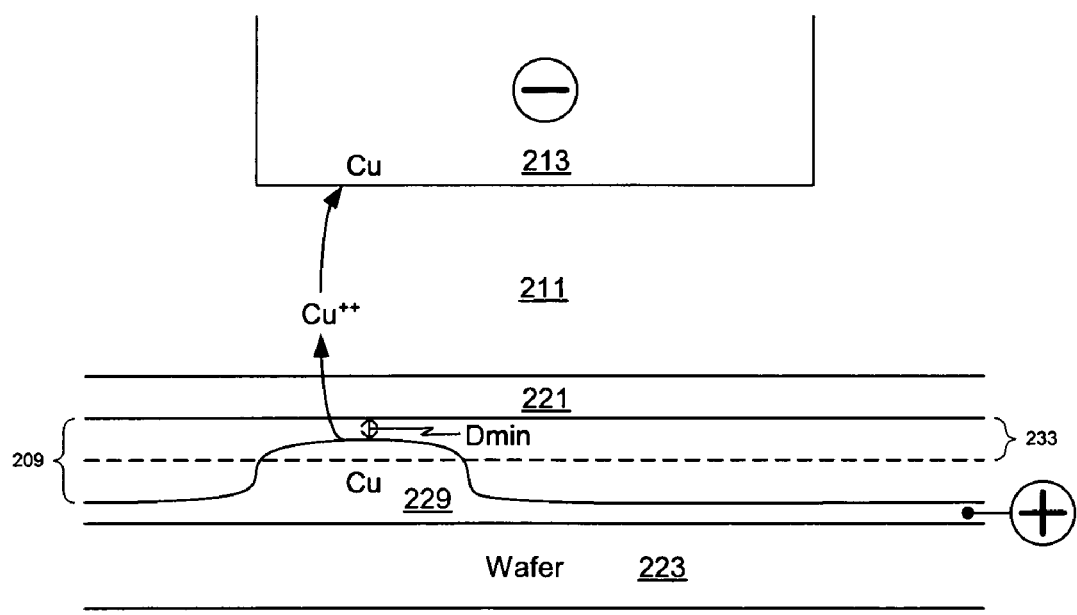
FIG. 2 is an illustration showing the EP process for planarizing a wafer, in accordance with one embodiment of the present invention.

The present invention provides an apparatus and method for performing electroplanarization (EP) of a wafer. More specifically, an EP apparatus is provided to establish a closed-loop cathode half-cell relationship with the surface of the wafer to be planarized. FIG. 2 is an illustration showing the EP process for planarizing a wafer 223, in accordance with one embodiment of the present invention. The wafer 223 includes a top surface defined by a metalized region 229 having a variable topography. As shown in FIG. 2, a one-way cation exchange membrane 221 ("membrane" 221) is positioned within proximity to the top surface of the wafer 223. The membrane 221 functions as a bulk fluid barrier between an electrolyte solution 211 at an upper side of the membrane 221 and deionized water 209 at a lower side of the membrane 221. The deionized water 209 forms a fluid layer between the membrane 221 and the wafer 223. The electrolyte solution 211 is in fluid communication with a cathode 213. In one embodiment, the membrane 221 is defined to have a thickness of about 0.050 inch. Also, the membrane 221 is defined to be flexible, particularly when exposed to the electrolyte solution 211.

The membrane 221 is defined as a polymer matrix including functional groups that form a network of channels through which cations can travel. In one embodiment, the membrane 221 is defined by a teflon base including sulfonic acid functional groups. In general, the membrane 221 is not permeable to water. However, water molecules can be "dragged" along with cations through the network of the functional groups. The membrane 221 allows cations to pass through the network of functional groups, while preventing anions from passing through the network of functional groups. Thus, the membrane 221 is a one-way cation exchange membrane.

Under the influence of an appropriate bias voltage cations will readily move through the membrane 221. Therefore, the membrane 221 is suitable for use in the EP process for removing metal, e.g., copper, from the top surface of the wafer 223. Specifically, metal cations, e.g., $Cu^{++}$ cations, can be made to move from the wafer 223, i.e., anode, to the cathode 213 under the influence of a bias voltage applied between the wafer 223 and the cathode 213. The bias voltage is applied between the wafer 223 and the cathode 213 such that the metalized top surface of the wafer 223 is maintained at a positive voltage relative to the cathode 213. As shown in FIG. 2, the membrane 221 is separated from the wafer 223 by the deionized water 209. Thus, the deionized water 209 provides a medium for transport of the metal cations, e.g., $Cu^{++}$ cations, from the wafer 223 to the membrane 221. Upon reaching the membrane 221, the metal cations can pass through the network of functional groups to reach the electrolyte solution 211. Upon reaching the electrolyte solution 211, the metal cations will travel to the cathode 213 and be plated on the cathode 213.

In addition to providing a network of cation exchange pathways, the functional groups, e.g., the sulfonic acid groups, within the membrane 221 also serve to modify a pH of the deionized water 209 within a vicinity of the membrane 221. The region of the deionized water 209 that is pH-influenced by the membrane 221 represents a critical boundary layer 233, as depicted by the region above the dashed line and below the membrane 221 in FIG. 2. The pH of the deionized water 209 within the critical boundary layer 233 is sufficiently influenced by the functional groups of the membrane 221 to enable etching of the metalized topography 229 on the top surface of the wafer 223, when the metalized topography 229 is exposed to the critical boundary layer 233. It should be appreciated that the pH influence exerted by the membrane 221 on the deionized water 209 within the critical boundary layer 233 drops with distance from the membrane 221. Therefore, etching reactions will occur at a faster rate within portions of the critical boundary layer 233 that are closer to the membrane 221.

Under the influence of the bias voltage applied between the cathode 213 and the anode, i.e., the metalized topography 229 on the surface of the wafer 223, metal cations such as $Cu^{++}$ that are liberated in the etching reactions within the critical boundary layer 233 will be directed through the membrane 221 and be plated on the cathode 213. Thus, exposure of the metalized topography 229 of the wafer 223 to the critical boundary layer 233 underlying the membrane 221 will enable planarization of the metalized topography 229. As the wafer 223 is moved beneath the membrane 221, higher topographical features on the surface of the wafer 223 will be closer to the membrane 221, and will therefore be etched at a higher rate relative to lower topographical features on the surface of the wafer 223. Thus, the more rapid etching of the higher topographical features on the surface of the wafer 223 enables the metalized topography 229 of the wafer 223 to be planarized in a substantially top-down manner.

To enable exposure of the metalized topography 229 to the critical boundary layer 233, the membrane 221 needs to be brought within close enough proximity to the wafer 223. However, if the membrane is brought too close to the wafer 223 in a static manner, the membrane will be attracted to wafer 223 and will adhere to the wafer 223. Direct contact between the membrane 221 and the wafer 223 is not desirable because the functional groups, e.g., sulfonic acid groups, of the membrane 221 will etch the metal from the wafer 223 too fast, resulting in damage to the wafer 223. Additionally, physical contact between the membrane 221 and the wafer 223 may physically damage the membrane 221 and/or wafer 223. To ensure that the membrane 221 does not adhere to the wafer 223, a minimum distance ($D_{min}$) must be maintained between the membrane 221 and the wafer 223.

In combination with the need to maintain the minimum distance ($D_{min}$) between the membrane 221 and the wafer 223, it is also necessary to expose the surface of the wafer 223 to the critical boundary layer 233. The critical boundary layer 233 thickness required for planarizing the wafer 223 may be on the order of tenths or hundredths of microns. Additionally, because the etch rate increases as the membrane 221 gets closer to the wafer 223, it is also necessary to control the uniformity of the separation distance between membrane 221 and the wafer 223. Thus, it is necessary for the separation distance between the membrane 221 and the wafer 223 to be adaptable to contour variations across the wafer 223.

It is conceivable that a contour, i.e., waviness, inherent in the wafer 223 may exceed the critical boundary layer 233 thickness. However, the ability of the membrane 221 to flex enables the membrane 221 to conform to the contour of the wafer 223, such that a uniform separation distance is maintained between the membrane 221 and the wafer 223. In other words, the flexibility of the membrane 221 enables the membrane 221 to follow the contour of the wafer 223 as the membrane 221 and wafer 223 move with respect to each other. Therefore, the mechanical characteristics of the membrane 221 enables exposure of the wafer 223 to the critical boundary layer 233 in a substantially uniform manner.

As previously mentioned, it is necessary to bring the critical boundary layer 233 below the membrane 221 in contact with the metalized topography 229 to be planarized, without allowing the membrane 221 to contact/adhere to the wafer 223. The EP apparatuses of the present invention accomplish this by controlling the electrolyte solution 211 pressure against the membrane, the force applied between the membrane 221 and the deionized water 209, and the relative motion between the membrane 221 and the wafer 223. Because the deionized water 209 is an incompressible fluid, the force exerted by the membrane 221 on the deionized water 209 will be counteracted to an extent commensurate with local displacement of the deionized water 209 by the membrane 221. The amount of local displacement of the deionized water 209 by the membrane 221 will be a function of the force applied between the membrane 221 and the deionized water 209 and the relative velocity of the membrane 221 with respect to the deionized water 209, i.e., with respect to the wafer 223.

Figure 3A:
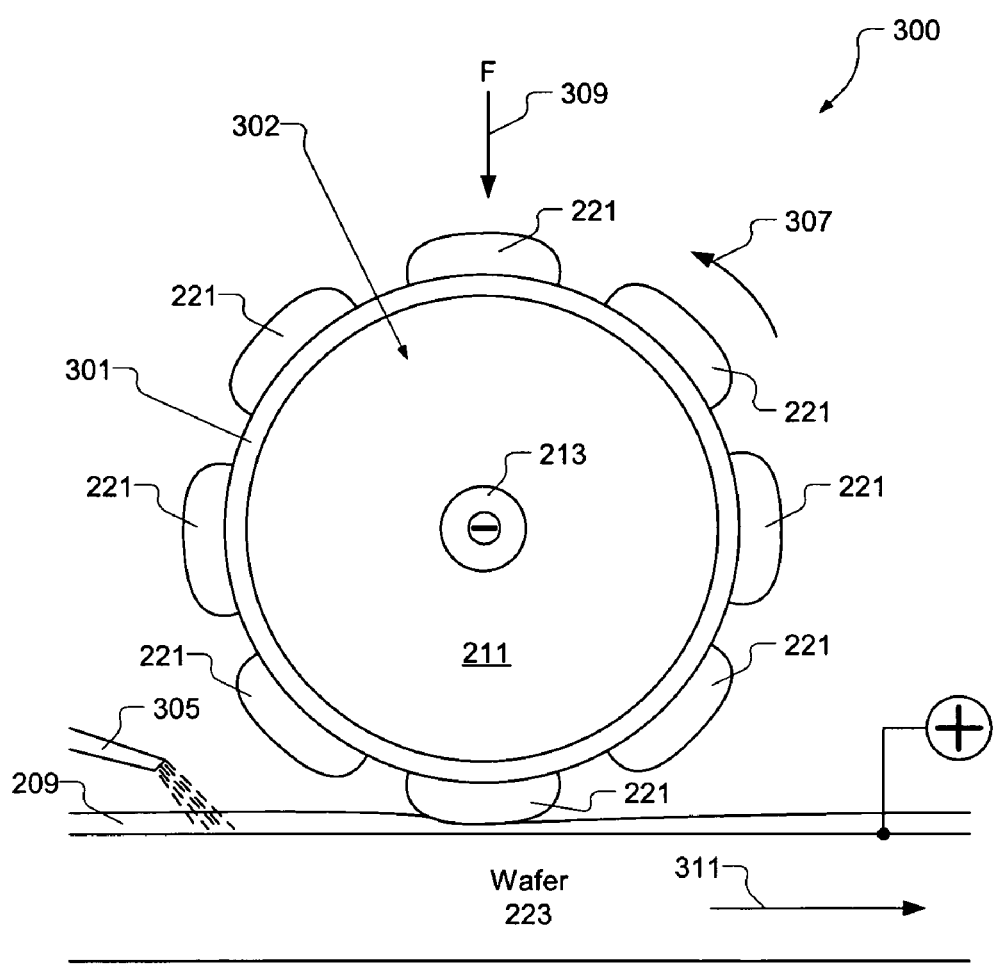
FIG. 3A is an illustration showing a vertical cross-sectional view of a cylindrical EP apparatus positioned over and proximate to the wafer to be planarized, in accordance with one embodiment of the present invention.

FIG. 3A is an illustration showing a vertical cross-sectional view of a cylindrical EP apparatus 300 positioned over and proximate to the wafer 223 to be planarized, in accordance with one embodiment of the present invention. The cylindrical EP apparatus includes a cylindrical-shaped wall 301 defining a cylindrical cavity 302 for receiving the membrane 221. The cylindrical-shaped wall 301 includes a number of apertures through which the membrane is exposed. In one embodiment, the number or apertures are positioned in a substantially uniform manner over the surface of the wall 301. In one embodiment, the apertures are round or oval shaped. However, in other embodiments, the apertures can be defined to have essentially any geometric shape. The cylindrical-shaped wall 301 is defined to be fitted with endcaps for sealing the cylindrical cavity 302 within the wall 301, such that a region within the membrane 221 can be filled and pressurized with the electrolyte solution 211. When the electrolyte solution 211 is pressurized, the membrane expands through the various apertures in the wall 211 to form an array of membrane 221 bulges in the shape of the apertures. The membrane 221 bulges extend outward beyond the outer surface of the wall 301.

The cylindrical EP apparatus 300 is further defined to include a cathode 213 positioned within the cylindrical cavity. In one embodiment, the cathode 213 is defined as a rod positioned in a substantially centralized location within the cavity defined by the wall 301. The cylindrical EP apparatus 300 is fitted with one or more fluid feed-through ports to allow for provision and removal of the electrolyte solution 211. In various embodiments the electrolyte solution 211 can be static or circulated. The cylindrical EP apparatus 300 is also fitted with an electrical feed-through port to enable electrical connection of the cathode 213 to a bias voltage source. In one embodiment, the fluid and electrical feed-through ports are defined within an axle about which the cylindrical EP apparatus is defined to rotate. Thus, in this embodiment, the fluid and electrical feed-through ports may remain in a fixed position as the cylindrical EP apparatus moves.

During the EP operation, the cylindrical EP apparatus 300 is rotated in a controlled manner, as indicated by arrow 307. It should be understood that the counter-clockwise direction of rotation indicated by arrow 307 is provided for exemplary purposes. In other embodiments, the cylindrical EP apparatus may rotate in a clockwise direction. In conjunction with the rotation, a downward force F is also applied to the cylindrical EP apparatus 300, as indicated by arrow 309. The downward force F causes the membrane 221 bulges to contact a layer of deionized water 209 present on the top surface of the wafer 223. In one embodiment, the layer of deionized water 209 is provided by a dispenser 305. It should be appreciated that the dispenser 305 may take various forms, e.g., a nozzle, a manifold, etc.

As the cylindrical EP apparatus rotates, the various membrane 221 bulges travel in a rotational manner to contact the layer of deionized water 209 present on the wafer 223 surface. It should be appreciated that the velocity of the membrane 221 bulges relative to the deionized water 209, the downward force F applied between the membrane 221 bulges and the deionized water 209, and the pressure exerted by the electrolyte solution 211 against the backside of the membrane 221 bulges combine together to enable the critical boundary layer 233 that is formed within the deionized water 209 in proximity to the membrane 221 bulges to be brought in contact with the metalized topography on the top surface of the wafer 223, without allowing the membrane 221 bulges to physically contact the wafer 223.

When the critical boundary layer 233 contacts the metalized topography, the pH within the critical boundary layer 233 causes metal cations to be liberated from the wafer 223. Because the metalized topography on the top surface of the wafer 223 is maintained at a positive bias voltage relative to the cathode 213, the liberated metal cations will be attracted from the wafer 223, through the deionized water 209, through the membrane 221, through the electrolyte solution 211, to the cathode 213. In one embodiment, the bias voltage between the wafer 223 and the cathode 213 is maintained within a range extending from about 10 V to about 25 V. It should be appreciated that electrical contact between the positive bias voltage source and the metalized topography on the top surface of the wafer 223 can be made using low-profile electrodes that do not interfere with the cylindrical EP apparatus 300. In one embodiment, a final polish operation may be performed at the edge of the wafer to remove metal that may have been masked by the electrode.

Rotation of the cylindrical EP apparatus 300 and positioning of the membrane 221 bulges over the surface of the cylindrical wall 301 enables the portion of the wafer 223 beneath the cylindrical EP apparatus 300 to be exposed to the critical boundary layer 233 in a time-averaged uniform manner. As the cylindrical EP apparatus 300 rotates, the wafer 223 is moved in a linear manner beneath the cylindrical EP apparatus 300, as indicated by arrow 311. The linear velocity of the wafer 223 beneath the cylindrical EP apparatus 300 can be set based on the amount of metal removal/planarization required. A slower linear velocity of the wafer 223 corresponds to an increased per unit area exposure of the metalized topography to the critical boundary layer 233, vice-versa. Thus, a slower linear velocity of the wafer 223 provides an increased amount of planarization per unit area.

The closed-loop cathode half-cell plates metal, e.g., Cu, ions as they pass through the membrane 221 when a potential difference is applied between the metalized topography of the wafer 223 and the cathode 213 within the cylindrical EP apparatus 300. The electrolyte solution 211 pressure applied against the membrane 221 can be controlled to maintain a constant down-force of the membrane 221 over the wafer 223. In one embodiment, the electrolyte solution 211 pressure within the cylindrical EP apparatus 300 is maintained within a range extending up to about 10 psig. For a given rate of rotation, control of both the downward force F and the electrolyte solution 211 pressure provides for control of the minimum separation distance (Dmin) between the membrane 221 and the wafer 223, and thus provides for control of the depth of wafer 223 exposure to the critical boundary layer 233. Hence, control of the rate of rotation, control of the downward force F, and control of the electrolyte solution 211 pressure enables control of the planarization characteristics.

Figure 3B:
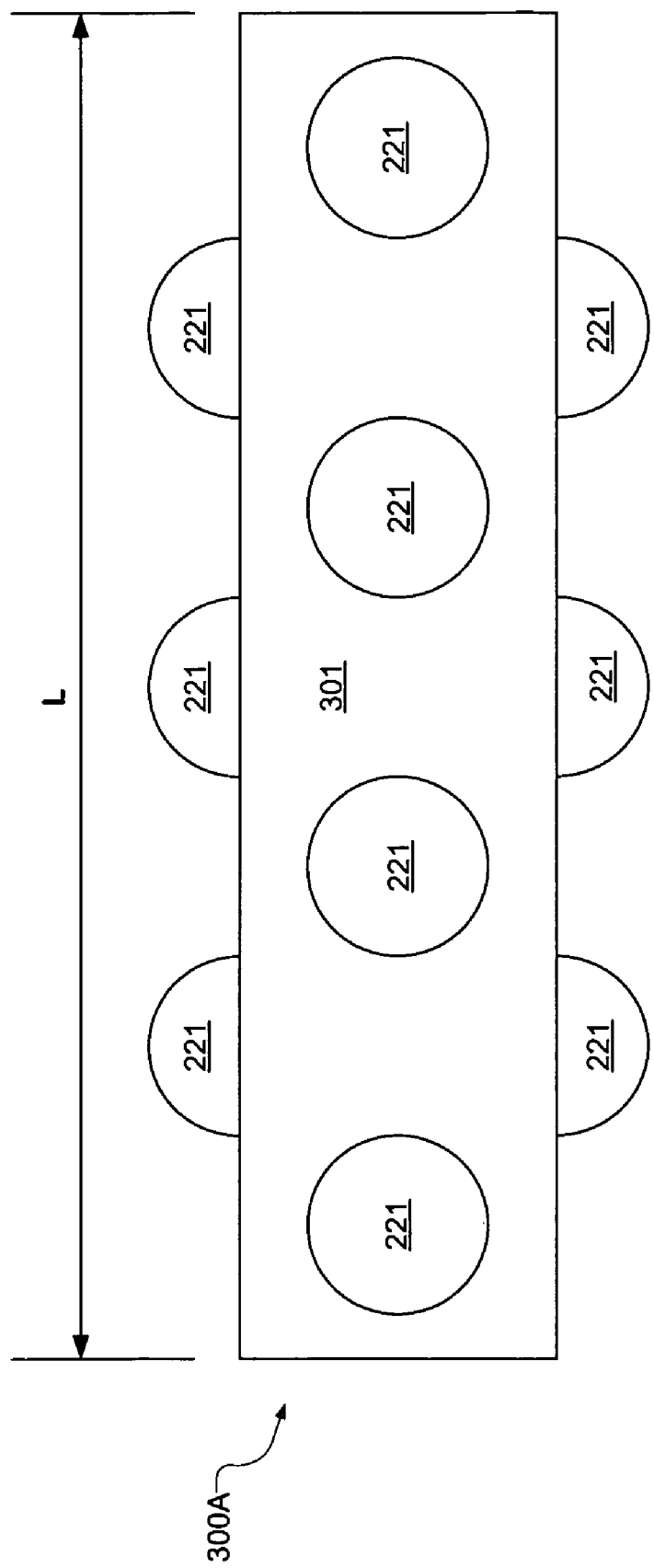
FIG. 3B is an illustration showing an exterior view of the cylindrical EP apparatus of FIG. 3A, in accordance with one embodiment of the present invention.

FIG. 3B is an illustration showing an exterior view of the cylindrical EP apparatus 300 of FIG. 3A, in accordance with one embodiment of the present invention. In one embodiment, the length (L) of the cylindrical EP apparatus 300 exceeds a diameter of the wafer 223. Therefore, once the wafer 223 has completely traversed beneath the cylindrical EP apparatus 300, the entire upper surface of the wafer will have been exposed to the critical boundary layer 233 beneath the membrane 221 bulges protruding from the outer surface of the cylindrical EP apparatus 300. It should be appreciated that the number, size, and placement of the membrane 221 bulges depicted in FIG. 3B are provided for illustrative purposes only. In various embodiments, the number, size, and placement of the membrane 211 bulges over the surface of the cylindrical EP apparatus 300 can be defined in an essentially unlimited variety of ways to provide the necessary exposure of the wafer 223 to the critical boundary layer 233.

Figure 3C:
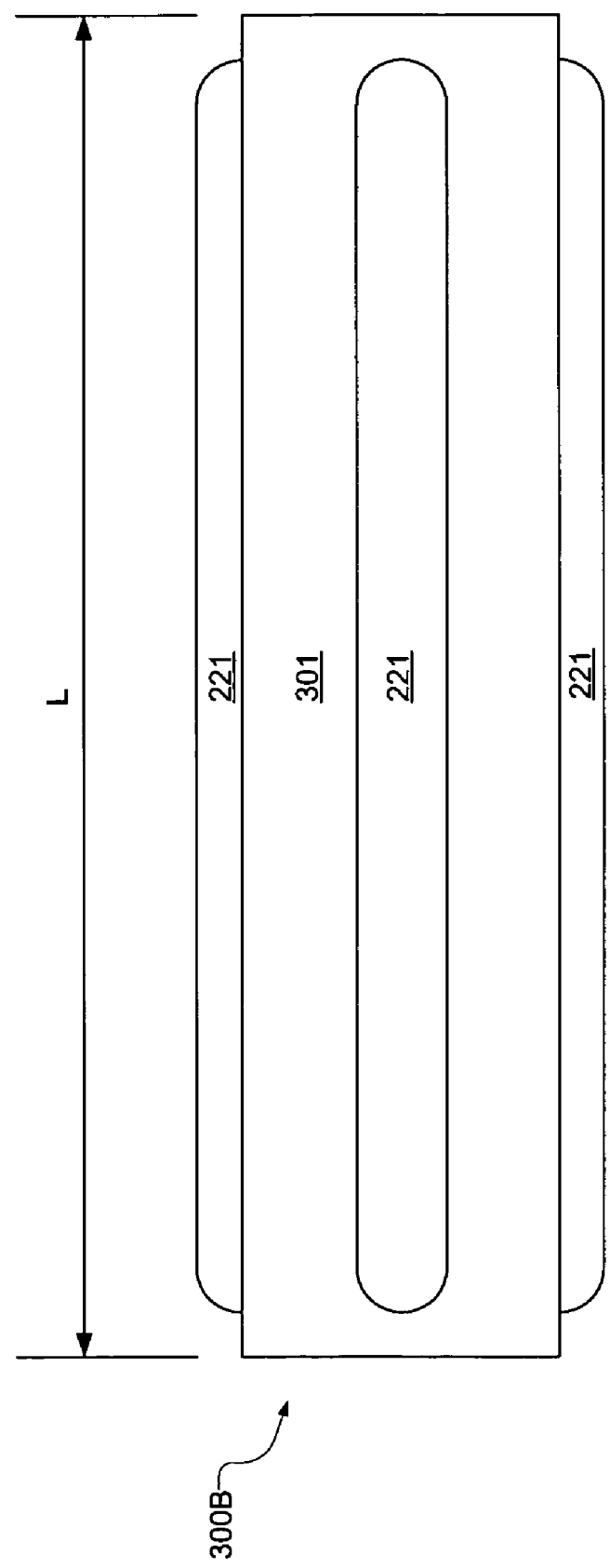
FIG. 3C is an illustration showing a cylindrical EP apparatus having membrane bulges of elongated shape, in accordance with one embodiment of the present invention.
Figure 3D:
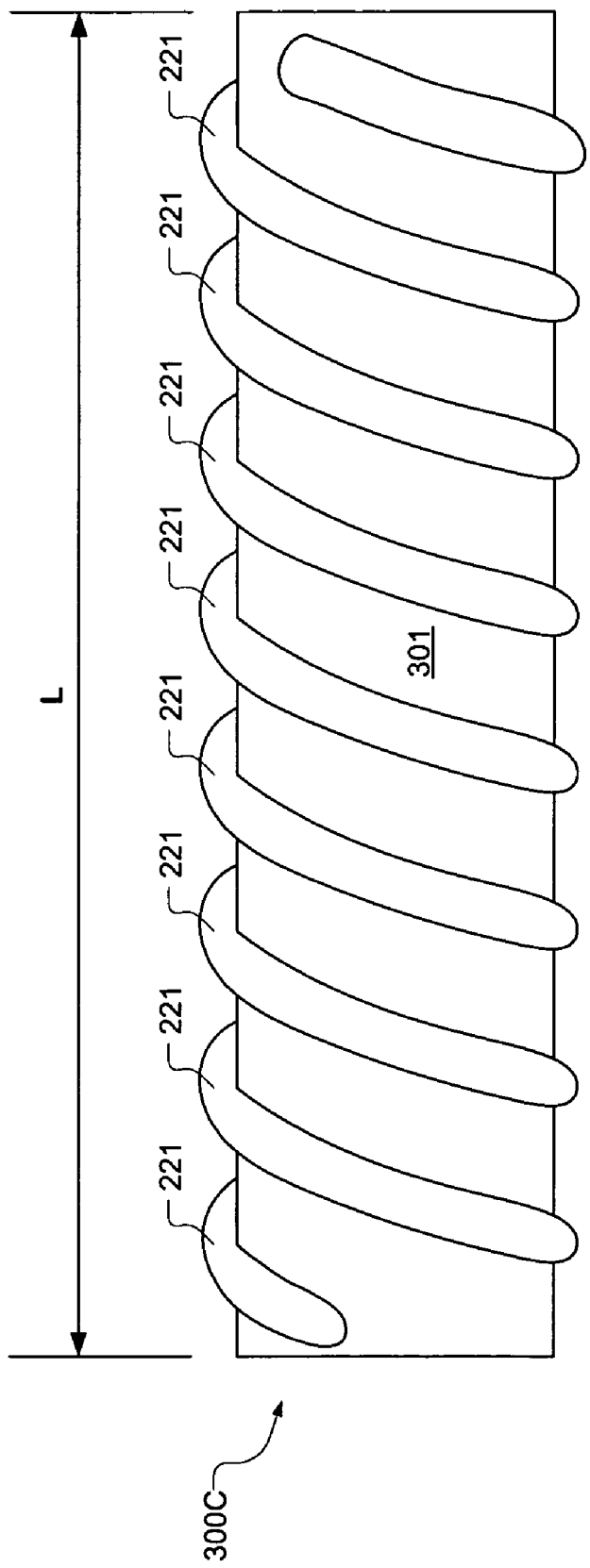
FIG. 3D is an illustration showing a cylindrical EP apparatus having spiral-shaped membrane bulges, in accordance with another embodiment of the present invention.

Additionally, the shape of the membrane 221 bulges through the wall 301 of the cylindrical EP apparatus 300 can be defined in an essentially unlimited variety of ways to provide the necessary exposure of the wafer 223 to the critical boundary layer 233. For example, FIG. 3C is an illustration showing a cylindrical EP apparatus 300A having membrane 221 bulges of elongated shape, in accordance with one embodiment of the present invention. FIG. 3D is an illustration showing a cylindrical EP apparatus 300B having spiral-shaped membrane 221 bulges, in accordance with another embodiment of the present invention.

Figure 3E:
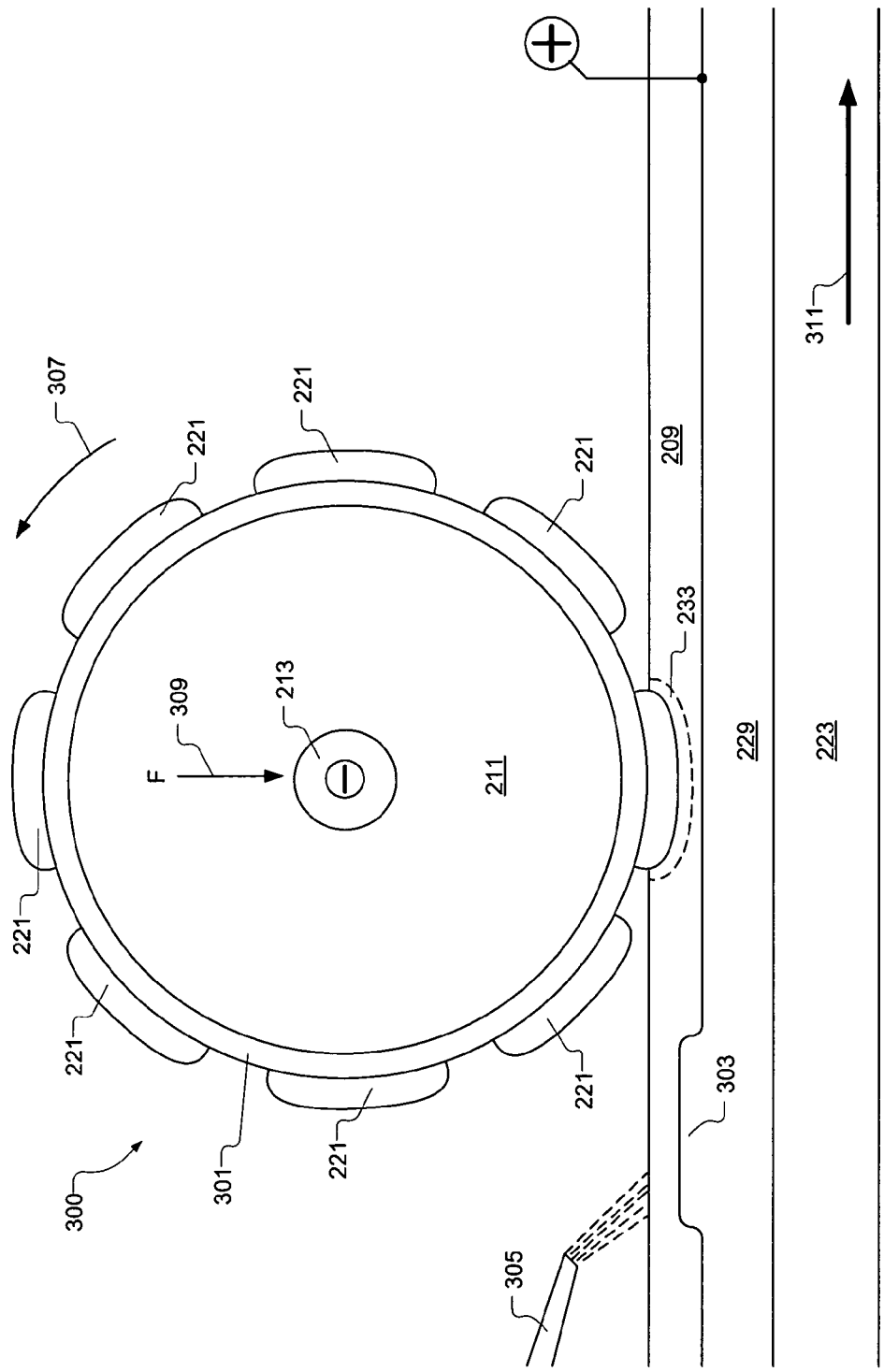
Figure 3G:
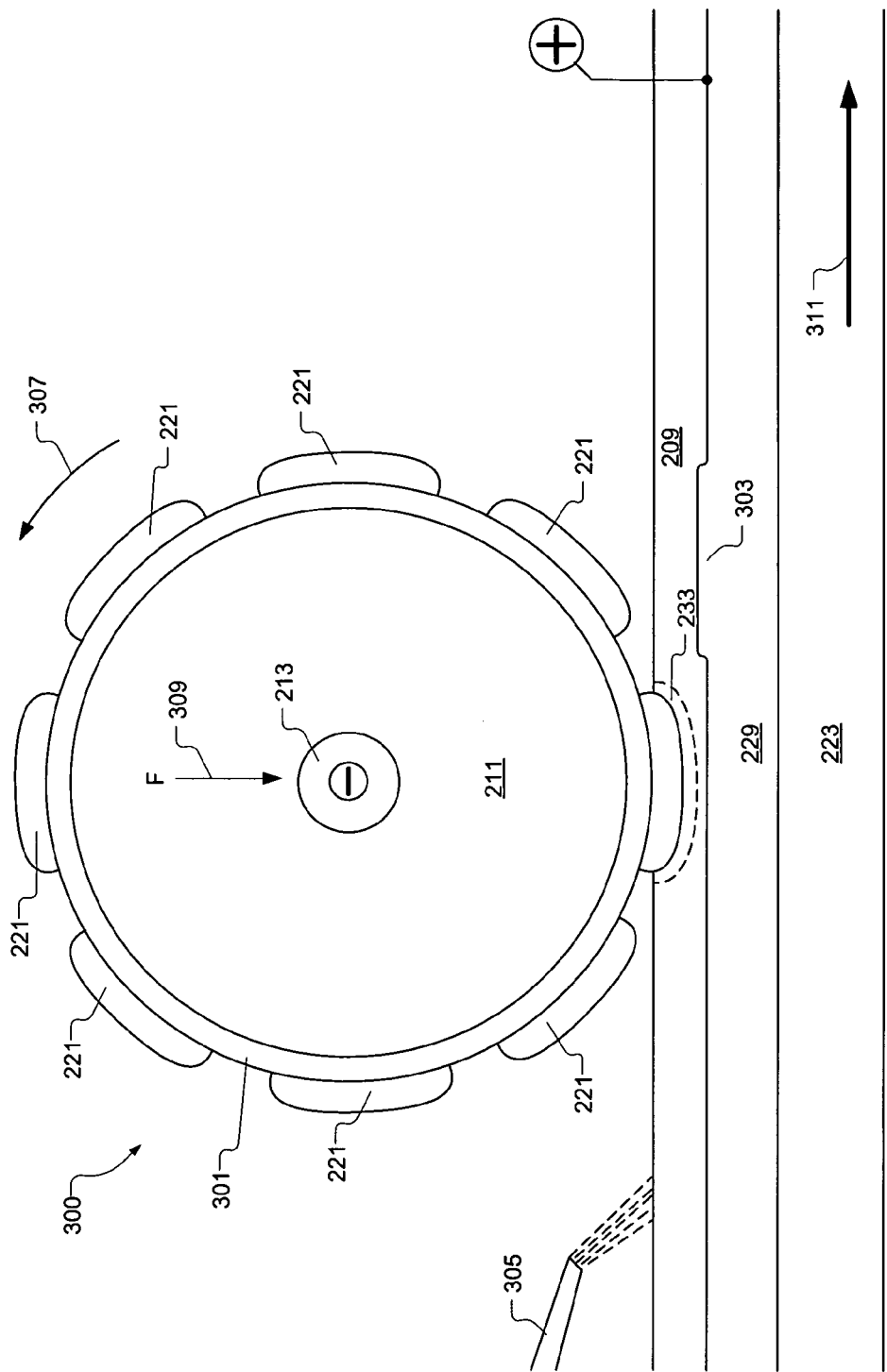

FIGS. 3E-3G are a series of illustrations showing traversal of the wafer 223 beneath the cylindrical EP apparatus 300, in accordance with one embodiment of the present invention. With respect to FIGS. 3E-3G, attention should be paid to the topographic feature 303 that is within the level occupied by the critical boundary layer 233 beneath the membrane 221. FIG. 3E represents the cylindrical EP apparatus 300 positioned just prior to traversal of the topographic feature 303 through the critical boundary layer 233. FIG. 3F represents the cylindrical EP apparatus 300 positioned such that the topographic feature 303 is within the critical boundary layer 233 beneath the membrane 221. FIG. 3G represents the cylindrical EP apparatus 300 positioned just after traversal of the topographic feature 303 through the critical boundary layer 233, such that the topographic feature 303 has been planarized.

The closed-loop cathode half-cell, defined between the metalized topography 229 on the wafer 223 surface and the cathode 213 within the electrolyte 211, functions to plate metal cations, e.g., $Cu^{++}$, as the metal cations pass from the topographical feature 303 through the membrane 221 to the cathode 213 under the influence of the bias voltage. The distance between the wafer 223 and the membrane 221 is controlled by the relative velocity between the membrane 221 and the wafer 223, the downforce F, and the electrolyte solution 211 pressure. The travel rate of the wafer 223 beneath the cylindrical EP apparatus 300 is set to provide a desired amount of planarization. More specifically, the exposure duration of the topographic feature 303 to the critical boundary layer 233 combined with the etch rate determines how much of the topographic feature 303 is removed during its traversal beneath the cylindrical EP apparatus 300, i.e., through the critical boundary layer 233. The etch rate is a function of the pH of the deionized water within the critical boundary layer 233 and the applied bias voltage. It should be understood that the pH of the deionized water within the critical boundary layer 233 is set by the composition of the membrane 221, i.e., by the functional groups within the membrane 221.

During traversal of the wafer 223 beneath the cylindrical EP apparatus 300, the metalized topography 229 on the top surface of the wafer 223 is electrically connected to one or more electrodes. In one embodiment, two electrodes are used to contact the metalized topography 229 on the top surface of the wafer 223. Each of these two electrodes is defined to be moved to electrically connect to and disconnect from the wafer 223. It should be appreciated that movement of the two electrodes to connect to and disconnect from the wafer 223 can be performed in a number of ways. For example, in one embodiment, the two electrodes can be moved linearly in a plane aligned with the wafer 223. In another embodiment, the two electrodes having a sufficient elongated shape and being oriented in a coplanar arrangement with the wafer 223 can be moved in a rotational manner to contact the wafer 223.

It should also be appreciated that the shape of the two electrodes can be defined in a number of ways. For example, in one embodiment, the two electrodes can be substantially rectangular in shape. In another embodiment, each of the two electrodes can have a wafer contacting edge defined to follow a curvature of the wafer 223 periphery. In yet another embodiment, the two electrodes can be C-shaped. It should be understood that the two electrodes of the present embodiment are independently controllable.

In the present embodiment the wafer 223 is made to traverse beneath the cylindrical EP apparatus 300 such that the rotational axis of the cylindrical EP apparatus 300 is substantially perpendicular to a virtual line extending between the two electrodes. As the wafer 223 moves beneath the cylindrical EP apparatus 300, the electrode farther from the cylindrical EP apparatus 300 is controlled to be electrically connected to the metalized topography 229 on the top surface of the wafer 223. Also, as the wafer 223 moves beneath the cylindrical EP apparatus 300, the electrode closer to the cylindrical EP apparatus 300 is controlled to be electrically disconnected from the metalized topography 229 on the top surface of the wafer 223. Connection of the two electrodes to the wafer 223 in the manner described above enables a current distribution present at the portion of the wafer 223 in exposure to the critical boundary layer 233 to be optimized. Additionally, connection of the two electrodes to the wafer 223 in the manner described above enables each electrode to be disconnected from the wafer 223 as the critical boundary layer 233 traverses thereover.

Although the present invention is described with respect to use of a single cylindrical EP apparatus 300, it should be understood that other embodiments may simultaneously utilize more than one cylindrical EP apparatus 300. For example, if it is desirable to increase the planarization throughput, the wafer 223 may travel at a faster rate beneath multiple cylindrical EP apparatuses 300. In one embodiment, the EP provided by the cylindrical EP apparatus 300 of the present invention may be used to achieve a uniform (planarized) layer of metal, e.g., Cu, remaining on the wafer 223. This uniform layer may be on the order of 1000 Angstroms to 2000 Angstroms thick in some embodiments. The wafer 223 having the uniform (planarized) layer of metal thereon, can then be processed through a separate final etch process to clear a necessary thickness of the remaining metal.

Figure 4:
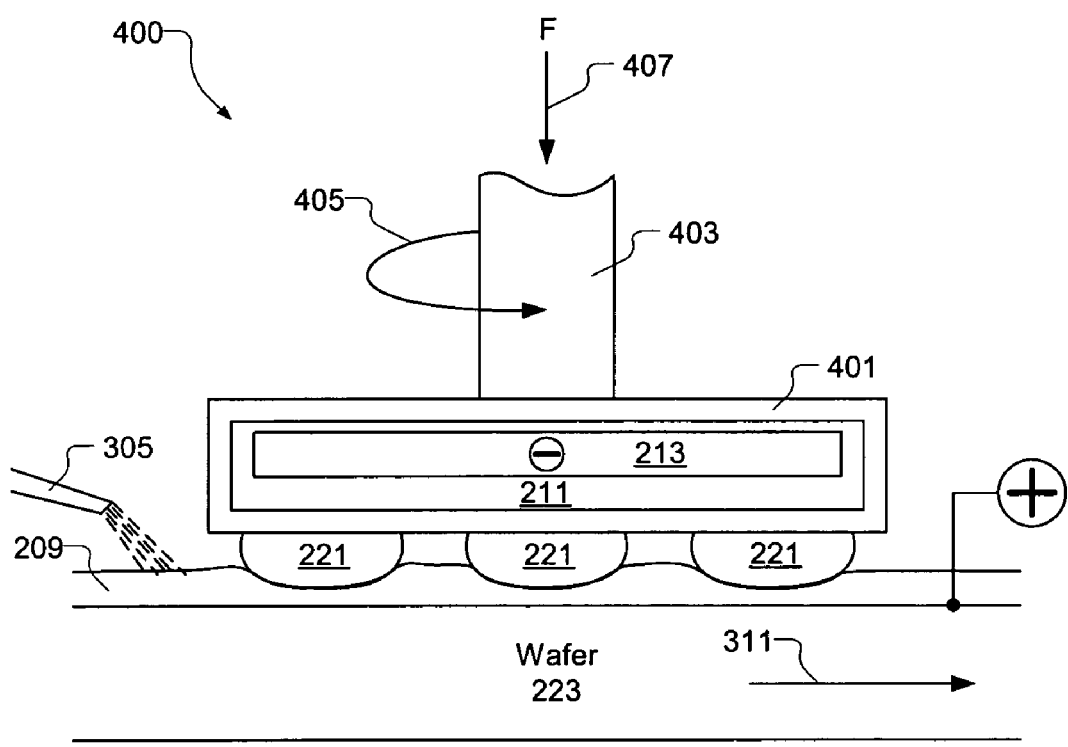
FIG. 4 is an illustration showing an EP head defined to implement the EP process previously described with respect to FIG. 2, in accordance with one embodiment of the present invention.

FIG. 4 is an illustration showing an EP head 400 defined to implement the EP process previously described with respect to FIG. 2, in accordance with one embodiment of the present invention. The EP head 400 includes a disc structure 401 rigidly connected to a shaft 403. The disc structure 401 includes an internal cavity defined to contain the electrolyte solution 211 and the cathode 213 in fluid communication with the electrolyte solution 211. In one embodiment, the cathode 213 is defined as a copper screen. The EP head 400 includes the membrane 221 disposed within the internal cavity to at least cover the bottom surface of the disc structure 401. The bottom surface of the disc structure 401 includes a number of apertures through which the membrane 221 is exposed. In one embodiment, the number of apertures are positioned in a substantially uniform manner over the bottom surface of the disc structure 401. In one embodiment, the apertures are round or oval shaped. However, in other embodiments, the apertures can be defined to have essentially any geometric shape. When the electrolyte solution 211 is pressurized, the membrane 221 expands through the various apertures in the bottom surface of the disc structure 401 to form an array of membrane 221 bulges in the shape of the apertures. The membrane 221 bulges extend outward beyond the bottom surface of the disc structure 401.

It should be appreciated that the EP head 400 is fitted with one or more fluid feed-through ports to allow for provision and removal of the electrolyte solution 211. In various embodiments the electrolyte solution 211 can be static or circulated. The EP head 400 is also fitted with an electrical feed-through port to enable electrical connection of the cathode 213 to a bias voltage source. In one embodiment, the fluid and electrical feed-through ports are defined within the shaft 403 about which the EP head 400 is defined to rotate. Thus, in this embodiment, the fluid and electrical feed-through ports may remain static as the EP head 400 moves.

During the EP operation, the EP head 400 is rotated in a controlled manner, as indicated by arrow 405. It should be understood that the counter-clockwise direction of rotation indicated by arrow 405 is provided for exemplary purposes. In other embodiments, the EP head 400 may rotate in a clockwise direction. In conjunction with the rotation, a downward force F is also applied to the EP head 400 through the shaft 403, as indicated by arrow 407. The downward force F causes the membrane 221 bulges to contact a layer of deionized water 209 present on the top surface of the wafer 223. In one embodiment, the layer of deionized water 209 is provided by the dispenser 305. As previously mentioned, the dispenser 305 may take various forms, e.g., a nozzle, a manifold, etc.

As the EP head 400 rotates, the various membrane 221 bulges travel over the deionized water 209 present on the wafer 223 surface. It should be appreciated that the velocity of the membrane 221 bulges relative to the deionized water 209, the downward force F applied between the membrane 221 bulges and the deionized water 209, and the pressure exerted by the electrolyte solution 211 against the backside of the membrane 221 bulges combine together to enable the critical boundary layer 233 that is formed within the deionized water 209 in proximity to the membrane 221 bulges to be brought in contact with the metalized topography on the top surface of the wafer 223, without allowing the membrane 221 bulges to physically contact the wafer 223.

When the critical boundary layer 233 contacts the metalized topography, the pH within the critical boundary layer 233 causes metal cations to be liberated from the wafer 223. Because the metalized topography on the top surface of the wafer 223 is maintained at a positive bias voltage relative to the cathode 213, the liberated metal cations will be attracted from the wafer 223, through the deionized water 209, through the membrane 221, through the electrolyte solution 211, to the cathode 213. In one embodiment, the bias voltage between the wafer 223 and the cathode 213 is maintained within a range extending from about 10 V to about 25 V. It should be appreciated that electrical contact between the positive bias voltage source and the metalized topography on the top surface of the wafer 223 can be made using low-profile electrodes that do not interfere with the EP head 400.

Rotation of the EP head 400 and positioning of the membrane 221 bulges over the bottom surface of the disc structure 401 enables the portion of the wafer 223 beneath the EP head 400 to be exposed to the critical boundary layer 233 in a time-averaged uniform manner. In one embodiment, as the EP head 400 rotates, the wafer 223 is moved in a linear manner beneath the EP head 400, as indicated by arrow 311. In another embodiment, the EP head 400 is both rotated and moved over the wafer 223 such that the entirety of the wafer 223 surface is uniformly exposed to the critical boundary layer 233. In variations of the above embodiment, the wafer 223 may be static or may be rotated. Regardless of the particular embodiment, the relative velocity of the wafer 223 with respect to the EP head 400 can be set based on the amount of metal removal/planarization required. An increased per unit area exposure of the metalized topography to the critical boundary layer 233 beneath the various membrane 221 bulges provides an increased amount of planarization.

The closed-loop cathode half-cell plates metal, e.g., Cu, ions as they pass through the membrane 221 when a potential difference is applied between the metalized topography of the wafer 223 and the cathode 213 within the EP head 400. The electrolyte solution 211 pressure applied against the membrane 221 can be controlled to maintain a constant downforce of the membrane 221 over the wafer 223. In one embodiment, the electrolyte solution 211 pressure within the EP head 400 is maintained within a range extending up to about 10 psig. For a given rate of rotation, control of the downward force F and the electrolyte solution 211 pressure provides for control of the minimum separation distance (Dmin) between the membrane 221 and the wafer 223, and thus provides for control of the depth of wafer 223 exposure to the critical boundary layer 233 with a corresponding effect on the planarization characteristics. Although the EP head 400 is illustrated above as having an area less than that of the wafer 223, it should be appreciated that in other embodiments the EP head 400 diameter may exceed the diameter of the wafer 223.

Figure 5:
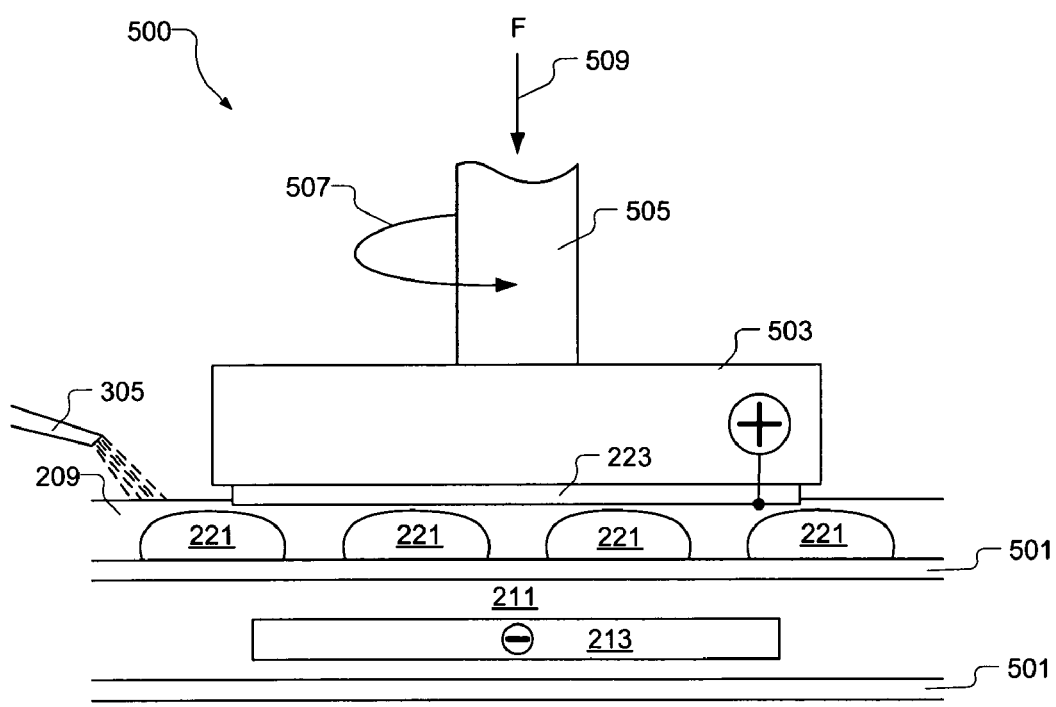
FIG. 5 is an illustration showing a platen EP apparatus defined to implement the EP process previously described with respect to FIG. 2, in accordance with one embodiment of the present invention.

FIG. 5 is an illustration showing a platen EP apparatus 500 defined to implement the EP process previously described with respect to FIG. 2, in accordance with one embodiment of the present invention. It should be noted that the platen EP apparatus 500 implements the EP process in an essentially inverted orientation with respect to FIG. 2. The platen EP apparatus 500 includes a platen structure 501 having an area larger than the wafer 223. The platen structure 501 includes an internal cavity defined by a top surface and a bottom surface. The internal cavity is defined to contain the electrolyte solution 211 and the cathode 213 in fluid communication with the electrolyte solution 211. In one embodiment, the cathode 213 is defined as a copper screen.

The platen EP apparatus 500 includes the membrane 221 disposed within the internal cavity to at least cover the top surface of the platen structure 501. The top surface of the platen structure 501 includes a number of apertures through which the membrane 221 is exposed. In one embodiment, the number of apertures are positioned in a substantially uniform manner over the top surface of the platen structure 501. In one embodiment, the apertures are round or oval shaped. However, in other embodiments, the apertures can be defined to have essentially any geometric shape. When the electrolyte solution 211 is pressurized, the membrane 221 expands through the various apertures in the top surface of the platen structure 501 to form an array of membrane 221 bulges in the shape of the apertures. The membrane 221 bulges extend outward beyond the top surface of the platen structure 501.

It should be appreciated that the platen EP apparatus 500 is fitted with one or more fluid feed-through ports to allow for provision and removal of the electrolyte solution 211. In various embodiments the electrolyte solution 211 can be static or circulated. The platen EP apparatus 500 is also fitted with an electrical feed-through port to enable electrical connection of the cathode 213 to a bias voltage source.

The platen EP apparatus 500 further includes a wafer carrier 503 rigidly connected to a shaft 505. The wafer carrier 503 is defined to hold the wafer 223 in a upside-down orientation, such that the top surface of the wafer 223 faces the membrane 221 bulges extending through the top surface of the platen structure 501. The wafer carrier 503 and attached shaft 505 are defined to be rotated in controlled manner, as indicated by arrow 507. In combination with the rotation, the wafer carrier 503 is also defined to apply a downward force F to the wafer 223, as indicated by arrow 509. The downward force F causes the top surface of the wafer 223 to contact a layer of deionized water 209 disposed to cover the membrane 221 bulges extending outward through the top surface of the platen structure 501. In one embodiment, the layer of deionized water 209 is provided by the dispenser 305. As previously mentioned, the dispenser 305 may take various forms, e.g., a nozzle, a manifold, etc.

During the EP operation, both the wafer carrier 503 and the platen structure 501 are rotated in a controlled manner. In one embodiment, the wafer carrier 503 and the platen structure 501 are defined to rotate in the same direction. In another embodiment, the wafer carrier 503 and the platen structure 501 rotate in opposite directions. Additionally, the rotation direction of the wafer carrier 503 and platen structure 501 can be either clockwise or counter-clockwise. In one embodiment the axis of rotation of the wafer carrier 503 is offset from the axis of rotation of the platen structure 501.

As the wafer 223 and the platen structure 501 rotate, the top surface of the wafer 223 travels over the various membrane 221 bulges. It should be appreciated that the velocity of the wafer 223 relative to the membrane 221 bulges, the downward force F applied to the wafer 223, and the pressure exerted by the electrolyte solution 211 against the backside of the membrane 221 bulges combine together to enable the critical boundary layer 233 that is formed within the deionized water 209 in proximity to the membrane 221 bulges to be brought in contact with the metalized topography on the top surface of the wafer 223, without allowing the membrane 221 bulges to physically contact the wafer 223.

When the critical boundary layer 233 contacts the metalized topography, the pH within the critical boundary layer 233 causes metal cations to be liberated from the wafer 223. Because the metalized topography on the top surface of the wafer 223 is maintained at a positive bias voltage relative to the cathode 213, the liberated metal cations will be attracted from the wafer 223, through the deionized water 209, through the membrane 221, through the electrolyte solution 211, to the cathode 213. In one embodiment, the bias voltage between the wafer 223 and the cathode 213 is maintained within a range extending from about 10 V to about 25 V. It should be appreciated that electrical contact between the positive bias voltage source and the metalized topography on the top surface of the wafer 223 can be made using low-profile electrodes that do not interfere with the platen EP apparatus 500.

During the EP process the flow of cations from the wafer 223 to the cathode 213 creates a measurable electric current. Thus, this electric current flows from the wafer 223 (anode) to the cathode 213. An electric current measuring device can be connected between the wafer 223 and the cathode 213 to measure the electric current flowing from the wafer 223 to the cathode 213. It should be appreciated that the electric current flowing from the wafer 223 to the cathode 213 is a function of the working contact area between the critical boundary layer 233 and the metalized topography 229 on the surface of the wafer 223. The working contact area represents the area of the metalized topography 229 within the critical boundary layer 223. Thus, the working contact area represents the area of the metalized topography 229 from which metal cations, e.g., $Cu^{++}$, are being removed.

As the higher portions of the metalized topography 229 are removed, i.e., planarized, the working contact area will increase, i.e., the wafer surface area within the critical boundary layer 233 will increase. Therefore, as the higher portions of the metalized topography 229 are removed, the flow of metal cations between the wafer 223 and the cathode 213 will increase. This increased flow of metal cations represents a measurable increase in electric current flowing from the wafer 223 to the cathode 213. Eventually, when the wafer becomes planarized, the working contact area becomes substantially constant. When the working contact area becomes substantially constant, the flow of metal cations from the wafer 223 to the cathode 213 become substantially constant, i.e., each portion of the wafer surface contributes equally to the flow of metal cations. Therefore, when the working contact area becomes substantially constant, the flow of electric current between the wafer 223 and the cathode 213 becomes substantially constant. Thus, a leveling-off of the electric current between the wafer 223 and the cathode 213 is an indication that the wafer 223 is planarized. Hence, the electric current between the wafer 223 and the cathode 213 can be monitored to detect an endpoint of the planarization process.

Figure 6:
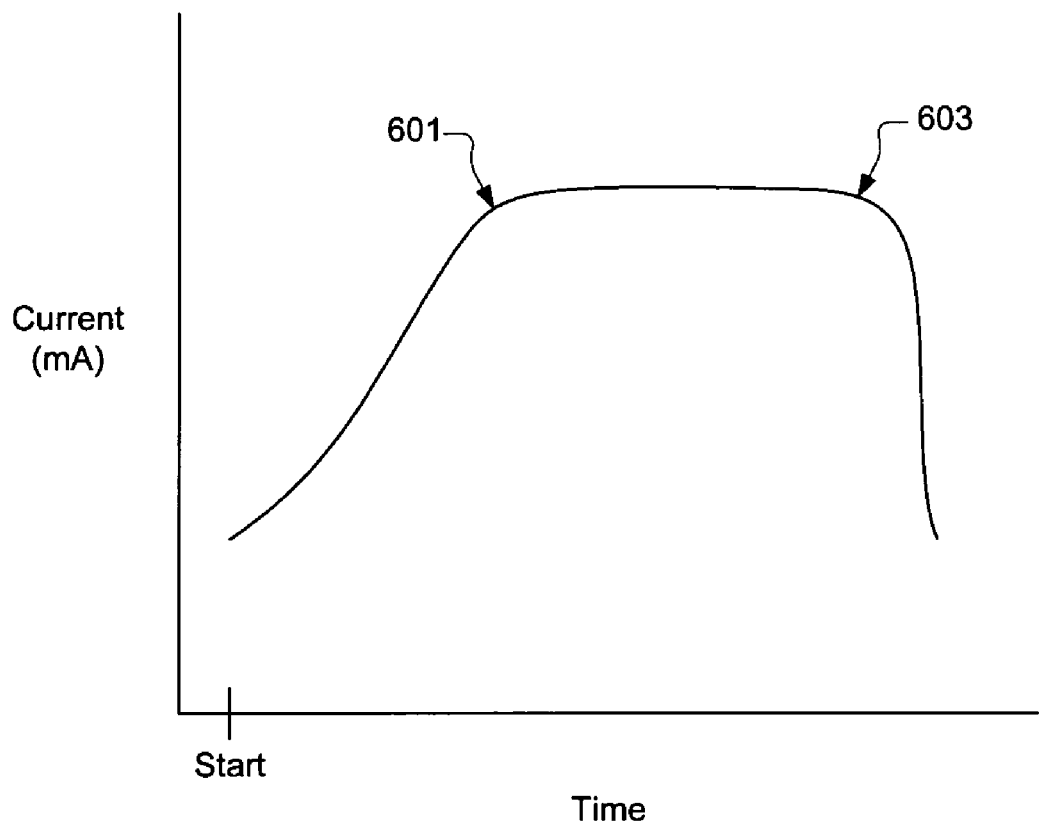
FIG. 6 is an illustration showing a chart of electric current flowing between the wafer and the cathode as a function of time during the confined area planarization process, in accordance with one embodiment of the present invention.

FIG. 6 is an illustration showing a chart of electric current flowing between the wafer 223 and the cathode 213 as a function of time during the confined area planarization process, in accordance with one embodiment of the present invention. For ease of discussion, the electric current flowing between the wafer 223 and the cathode 213 will be referred to as the "current." From the start of the EP process, the current increases steadily as the wafer is planarized. As discussed above, the steady increase in current is due to exposure of more metalized topography 229 to the critical boundary layer 233 as the higher portions of the metalized topography 229 become planarized.

As the metalized topography 229 approaches a planarized state, the current begins to level off. When the wafer 223 becomes substantially planarized, each portion of the wafer surface will be exposed in a substantially equal manner to the critical boundary layer 233. Thus, when the wafer 223 becomes substantially planarized, the current will level off as indicated by a location 601 on the curve of FIG. 6. The location 601 represents the endpoint of the EP process. If the EP process continues beyond the time corresponding to the location 601, the current will remain substantially level. Eventually, however, enough metal will be removed from the wafer 223 such that electrically non-conductive layers underlying the previously present metalized topography 229 will be exposed. When the electrically non-conductive layers are exposed, the current will drop as indicated by a location 603 on the curve of FIG. 6. Thus, the location 603 represents the breakthrough point of the EP process.

In one embodiment, the EP process may be continued until the breakthrough point is reached. However, in another embodiment, the EP process may be continued until the planarization endpoint is reached. Because the metalized topography 229 is removed in a top-down manner, it is generally expected that a planarized layer of metal will remain on the wafer surface when the planarization endpoint is reached. Upon reaching the planarization endpoint of the EP process, the wafer 223 may be subjected to a separate final etch process, e.g., wet clean etch process or plasma etch back process, to uniformly remove a required thickness of the remaining metal present on the wafer surface.

Figure 7:
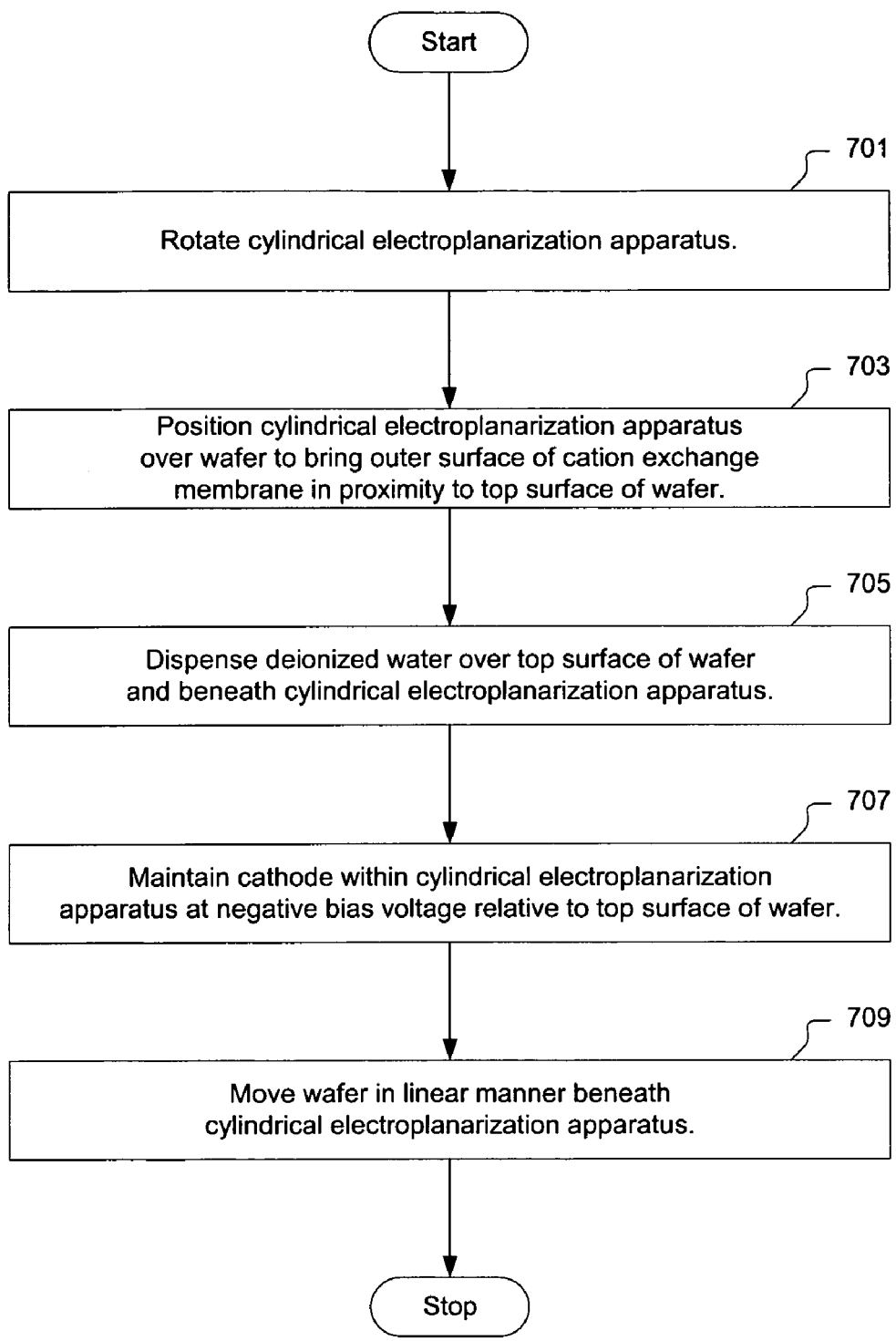
FIG. 7 is an illustration showing a flowchart of a method for planarizing a semiconductor wafer, in accordance with one embodiment of the present invention.

FIG. 7 is an illustration showing a flowchart of a method for planarizing a semiconductor wafer, in accordance with one embodiment of the present invention. The method includes an operation 701 for rotating a cylindrical EP apparatus. It should be understood that the cylindrical EP apparatus associated with the method of FIG. 7 corresponds to the cylindrical EP apparatus 300 described above with respect to FIGS. 2-3G. In an operation 703, the cylindrical EP apparatus 300 is positioned over a wafer to be planarized such that the outer surface of the cation exchange membrane 221 is brought within proximity to a top surface of the wafer 223 when the cylindrical EP apparatus 300 is rotated.

The method of FIG. 7 further includes an operation 705 for dispensing deionized water over the top surface of the wafer and beneath the cylindrical EP apparatus 300. In an operation 707, the cathode 213 within the cylindrical EP apparatus 300 is maintained at a negative bias voltage relative to the top surface of the wafer. While the cylindrical EP apparatus 300 is rotating, an operation 709 is performed to move the wafer in a linear manner beneath the cylindrical EP apparatus 300 such that the metalized topography on the top surface of the wafer is exposed to the critical boundary layer defined within the deionized water in proximity to the cation exchange membrane.

Figure 8:
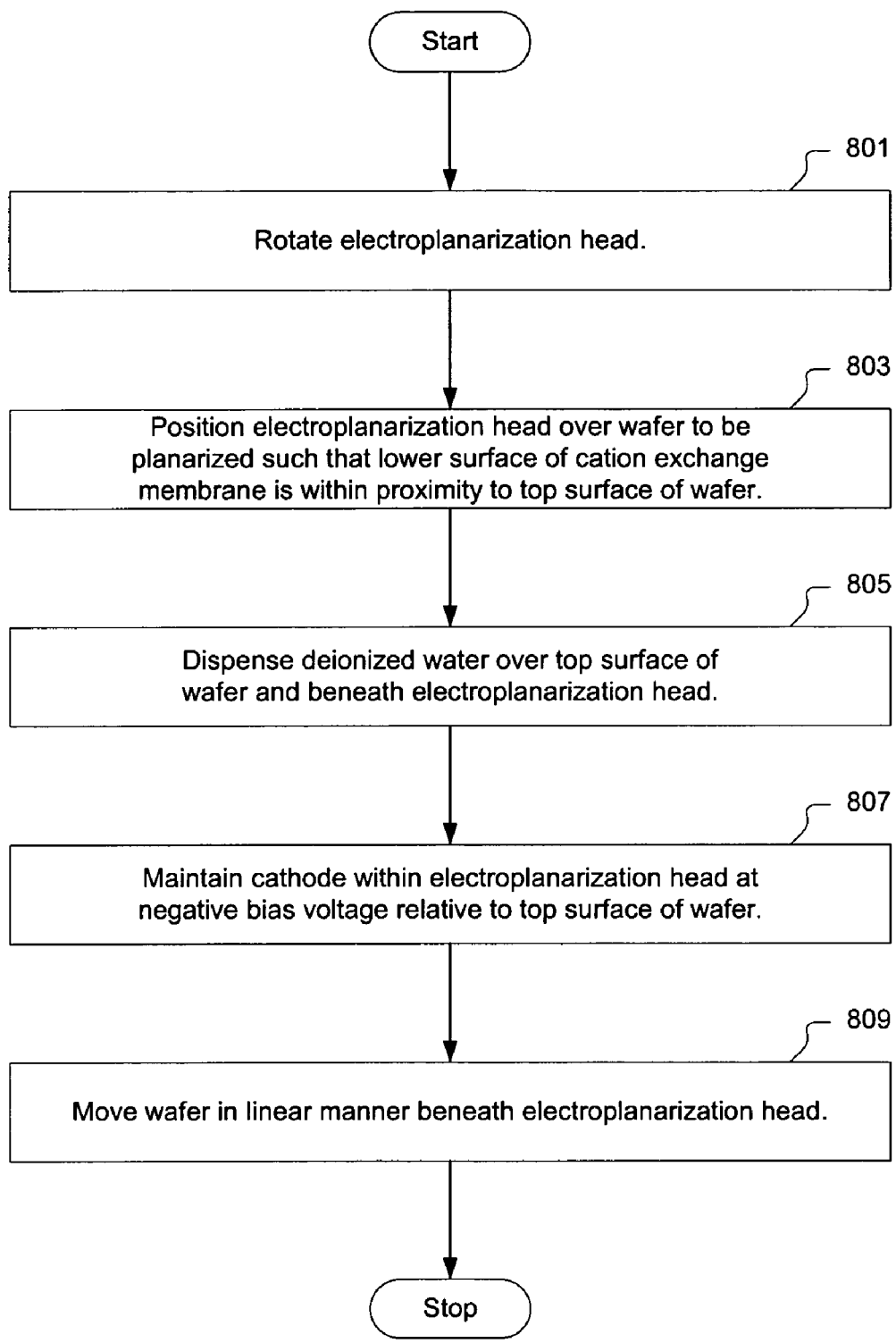
FIG. 8 is an illustration showing a flowchart of a method for planarizing a semiconductor wafer, in accordance with one embodiment of the present invention.

FIG. 8 is an illustration showing a flowchart of a method for planarizing a semiconductor wafer, in accordance with one embodiment of the present invention. The method includes an operation 801 for rotating an EP head. It should be understood that the EP head associated with the method of FIG. 8 corresponds to the EP head 400 described above with respect to FIGS. 2 and 4. In an operation 803, the EP head 400 is positioned over a wafer to be planarized such that the lower surface of the cation exchange membrane is within proximity to a top surface of the wafer when the EP head 400 is rotated.

The method of FIG. 8 further includes an operation 805 for dispensing deionized water over the top surface of the wafer and beneath the EP head 400. In an operation 807, the cathode 213 within the EP head 400 is maintained at a negative bias voltage relative to the top surface of the wafer. While the EP head 400 is rotating, an operation 809 is performed to move the wafer in a linear manner beneath the EP head 400 such that the metalized topography on the top surface of the wafer is exposed to the critical boundary layer defined within the deionized water in proximity to the cation exchange membrane.

Figure 9:
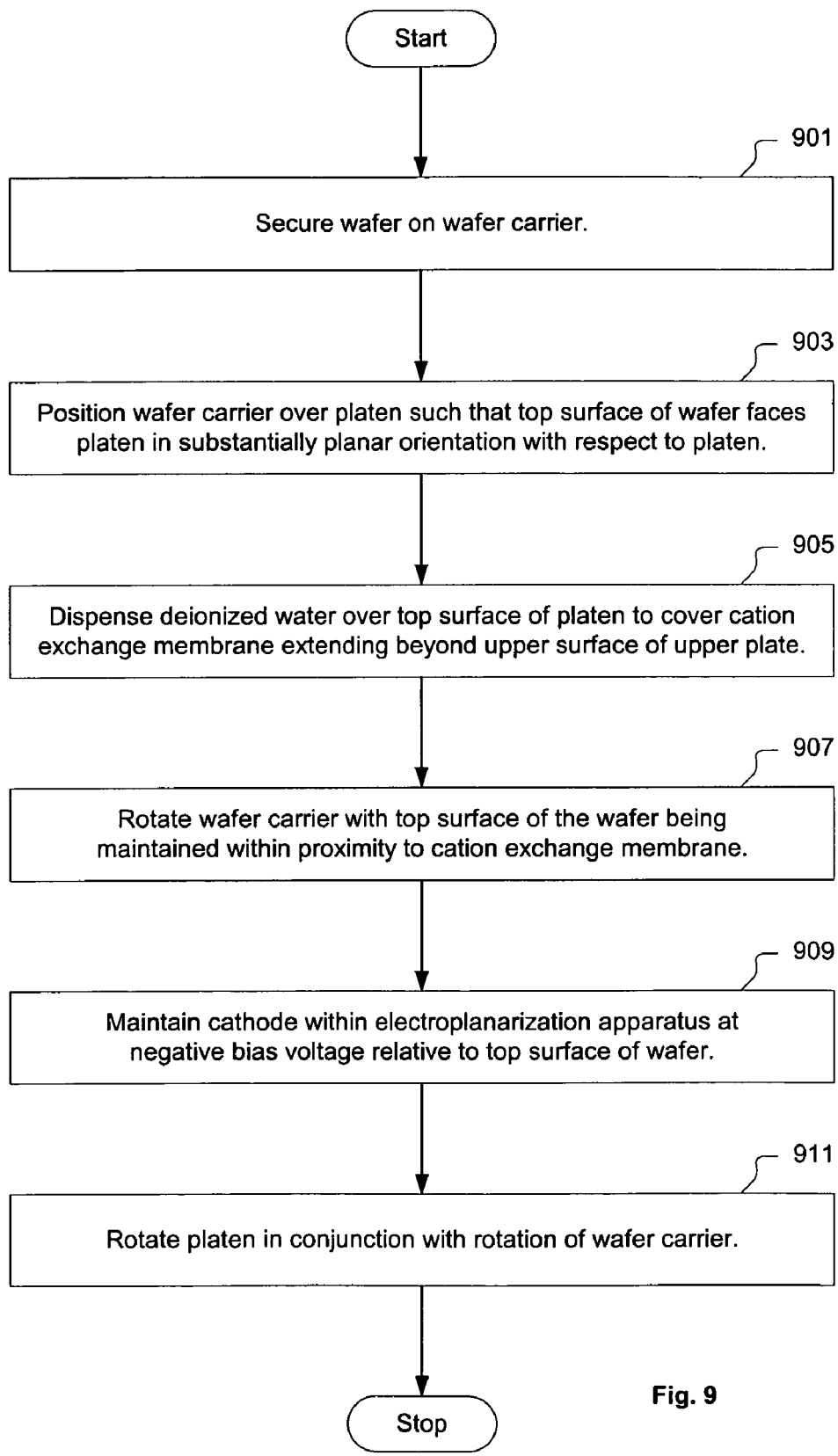
FIG. 9 is an illustration showing a flowchart of a method for planarizing a semiconductor wafer, in accordance with one embodiment of the present invention.

FIG. 9 is an illustration showing a flowchart of a method for planarizing a semiconductor wafer, in accordance with one embodiment of the present invention. It should be understood that the method of FIG. 9 is performed using the platen EP apparatus 500 described above with respect to FIGS. 2 and 5. The method includes an operation 901 for securing a wafer on the wafer carrier 503. In an operation 903, the wafer carrier 503 is positioned over the platen 501 such that the top surface of the wafer faces the platen 501 in a substantially planar orientation with respect to the platen 501.

The method of FIG. 9 further includes an operation 905 for dispensing deionized water over the top surface of the platen 501 to cover the cation exchange membrane 221 extending beyond the upper surface of the upper plate of the platen 501. An operation 907 is provided for rotating the wafer carrier 503 with the top surface of the wafer being maintained in proximity to the cation exchange membrane 221 extending beyond the upper surface of the upper plate. In an operation 909, the cathode 213 within the platen EP apparatus 500 is maintained at a negative bias voltage relative to the top surface of the wafer. An operation 911 is performed to rotate the platen in conjunction with rotation of the wafer carrier.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. An electroplanarization apparatus, comprising:
  a cylinder defined by a cylindrical wall and a pair of endcaps disposed to enclose a respective end of the cylinder, wherein a number of apertures are defined through the cylindrical wall;
  a cation exchange membrane disposed on an inner surface of the cylindrical wall to cover each of the number of apertures, the cation exchange membrane defined to extend through the number of apertures such that an outer surface of the cation exchange membrane extends beyond an outer surface of the cylindrical wall; and
  a cathode disposed within an inner cavity of the cylinder, the cathode defined to be in fluid communication with an electrolyte solution to be maintained within the cylinder in contact with an inner surface of the cation exchange membrane.

2. An electroplanarization apparatus as recited in claim 1, further comprising:

an axle about which the cylinder can be rotated, the axle disposed along a central axis of the cylindrical wall.

3. An electroplanarization apparatus as recited in claim 1, wherein the number of apertures are distributed over the cylindrical wall such that a given location proximate to the cylinder will be exposed to the outer surface of the cation exchange membrane in a time-averaged uniform manner when the cylinder is rotated.

4. An electroplanarization apparatus as recited in claim 1, wherein the cylinder is capable of maintaining the electrolyte solution under pressure, the electrolyte solution under pressure causing the cation exchange membrane to extend through the number of apertures.

5. An electroplanarization apparatus as recited in claim 1, wherein the cathode is electrically connected to be maintained at a negative bias voltage relative to a top surface of a wafer to be brought in electrical communication with the outer surface of the cation exchange membrane.

6. An electroplanarization apparatus as recited in claim 1, wherein the cation exchange membrane is defined to enable cation flow through the membrane and block anion flow through the membrane while providing bulk fluid confinement.

7. An electroplanarization apparatus as recited in claim 1, wherein the cation exchange membrane is capable of influencing a pH of deionized water to which the cation exchange membrane is exposed, the pH influenced deionized water capable of causing cations to be liberated from an anodic material when placed in exposure to the pH influenced deionized water.

8. An electroplanarization apparatus, comprising:
a chamber defined by a lower disc-shaped wall, an upper disc-shaped wall, and a cylindrical side wall, wherein a number of apertures are defined through the lower disc-shaped wall;
a cation exchange membrane disposed on an upper surface of the lower disc-shaped wall to cover each of the number of apertures, the cation exchange membrane defined to extend through the number of apertures such that a lower surface of the cation exchange membrane extends beyond a lower surface of the lower disc-shaped wall; and
a cathode disposed within the chamber, the cathode defined to be in fluid communication with an electrolyte solution to be maintained within the chamber in contact with an upper surface of the cation exchange membrane.

9. An electroplanarization apparatus as recited in claim 8, further comprising:
a shaft connected in a substantially perpendicular manner to a central location of the upper disc-shaped wall, wherein the shaft is defined to be rotated such that the chamber is rotated.

10. An electroplanarization apparatus as recited in claim 8, wherein the number of apertures are distributed over the lower disc-shaped wall such that a given location proximate to the lower disc-shaped wall will be exposed to the lower surface of the cation exchange membrane in a time-averaged uniform manner when the chamber is rotated.

11. An electroplanarization apparatus as recited in claim 8, wherein the chamber is capable of maintaining the electrolyte solution under pressure, the electrolyte solution under pressure causing the cation exchange membrane to extend through the number of apertures.

12. An electroplanarization apparatus as recited in claim 8, wherein the cathode is electrically connected to be maintained at a negative bias voltage relative to a top surface of a wafer to be brought in electrical communication with the lower surface of the cation exchange membrane.

13. An electroplanarization apparatus as recited in claim 8, wherein a diameter of the lower disc-shaped wall exceeds a diameter of a wafer to be planarized by the electroplanarization apparatus.

14. An electroplanarization apparatus as recited in claim 8, wherein the cation exchange membrane is defined as a polymer matrix including functional groups that form a network of channels through which cations can travel.

15. An electroplanarization apparatus, comprising:
a platen including a chamber bounded by an upper plate, wherein a number of apertures are defined through the upper plate;
a cation exchange membrane disposed within the chamber below the upper plate to cover each of the number of apertures, the cation exchange membrane defined to extend through the number of apertures such that an upper surface of the cation exchange membrane extends beyond an upper surface of the upper plate; and
a cathode disposed within the chamber, the cathode defined to be in fluid communication with an electrolyte solution to be maintained within the chamber in contact with a lower surface of the cation exchange membrane.

16. An electroplanarization apparatus as recited in claim 15, wherein the platen is defined to be rotated.

17. An electroplanarization apparatus as recited in claim 15, wherein the cathode is electrically connected to be maintained at a negative bias voltage relative to a top surface of a wafer to be brought in electrical communication with the upper surface of the cation exchange membrane.

18. An electroplanarization apparatus as recited in claim 15, further comprising:
a wafer carrier defined to hold a wafer such that a top surface of the wafer faces downward toward the platen, the wafer carrier defined to hold the wafer in a substantially parallel orientation with respect to the platen and in proximity to the cation exchange membrane extending through the number of apertures.

19. An electroplanarization apparatus as recited in claim 18, wherein the wafer carrier is defined to be rotated such that the wafer is rotated when placed in proximity to the cation exchange membrane extending through the number of apertures.

20. An electroplanarization apparatus as recited in claim 19, wherein an axis of rotation of the wafer carrier is offset from an axis of rotation of the platen by at least a radius of the wafer to be held by the wafer carrier.

* * * * *